United States Patent
Nakahara et al.

(10) Patent No.: US 8,946,727 B2
(45) Date of Patent: *Feb. 3, 2015

(54) ZINC OXIDE BASED COMPOUND SEMICONDUCTOR DEVICE

(75) Inventors: Ken Nakahara, Kyoto (JP); Kentaro Tamura, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 1194 days.

This patent is subject to a terminal disclaimer.

(21) Appl. No.: 11/886,852

(22) PCT Filed: Mar. 23, 2006

(86) PCT No.: PCT/JP2006/305804
§ 371 (c)(1),
(2), (4) Date: Sep. 21, 2007

(87) PCT Pub. No.: WO2006/101157
PCT Pub. Date: Sep. 28, 2006

(65) Prior Publication Data
US 2009/0034568 A1 Feb. 5, 2009

(30) Foreign Application Priority Data
Mar. 24, 2005 (JP) .................. 2005-086977

(51) Int. Cl.
*H01L 27/15* (2006.01)
*H01L 29/221* (2006.01)
(Continued)

(52) U.S. Cl.
CPC ............ *H01L 29/221* (2013.01); *H01L 29/045* (2013.01); *H01L 29/225* (2013.01); *H01L 29/7787* (2013.01); *H01L 5/327* (2013.01); *H01L 21/02403* (2013.01); *H01L 21/02414* (2013.01); *H01L 21/02433* (2013.01); *H01L 21/02472* (2013.01); *H01L 21/02505* (2013.01); *H01L 21/02554* (2013.01);
(Continued)

(58) Field of Classification Search
USPC ........................................... 257/79
See application file for complete search history.

(56) References Cited

U.S. PATENT DOCUMENTS 6,716,479 B2 * 4/2004 Lu et al. ................... 427/100
2004/0164314 A1 * 8/2004 Nakahara .................. 257/103
(Continued)

FOREIGN PATENT DOCUMENTS

CN        1694272 A      11/2005
JP        2002-094114    3/2002
(Continued)

*Primary Examiner* — Yu-Hsi D Sun
(74) *Attorney, Agent, or Firm* — Rabin & Berdo, P.C.

(57) ABSTRACT

There is provided a zinc oxide based compound semiconductor device in which drive voltage is not raised, property of crystal is satisfactory and device characteristics is excellent, even when the semiconductor device is formed by forming a lamination portion having a hetero junction of the ZnO based compound semiconductor layers. The zinc oxide based compound semiconductor device includes a substrate (1) made of $Mg_xZn_{1-x}O$ ($0 \le x \le 0.5$), the principal plane of which is a plane A (11-20) or a plane M (10-10), and single crystal layers (2) to (6) made of zinc oxide based compound semiconductor, which are epitaxially grown on the principal plane of the substrate (1) in such orientation that a plane parallel to the principal plane is a plane {11-20} or a plane {10-10} and a plane perpendicular to the principal plane is a plane {0001}.

5 Claims, 4 Drawing Sheets

(51) Int. Cl.
    *H01L 29/04*     (2006.01)
    *H01L 29/225*     (2006.01)
    *H01L 29/778*     (2006.01)
    *H01L 21/02*     (2006.01)
    *H01L 33/16*     (2010.01)
    *H01L 33/28*     (2010.01)
    *H01S 5/042*     (2006.01)
    *H01S 5/22*     (2006.01)
    *H01S 5/223*     (2006.01)

(52) U.S. Cl.
    CPC ... *H01L 21/02565* (2013.01); *H01L 21/02576* (2013.01); *H01L 21/02579* (2013.01); *H01L 21/02609* (2013.01); *H01L 21/02631* (2013.01); *H01L 33/16* (2013.01); *H01L 33/28* (2013.01); *H01S 5/0422* (2013.01); *H01S 5/2224* (2013.01); *H01S 5/2231* (2013.01)
    USPC .......................................................... 257/79

(56) References Cited

U.S. PATENT DOCUMENTS

2004/0235212 A1*   11/2004   Ishizaki ..................... 438/46
2005/0242357 A1    11/2005   Uematsu et al.

FOREIGN PATENT DOCUMENTS

JP         2004-200389 A     7/2004
WO      WO-01/73170         4/2001

* cited by examiner (a)

COMPRESSIVE FORCE (b)

TENSILE FORCE (c)

US 8,946,727 B2

ZINC OXIDE BASED COMPOUND SEMICONDUCTOR DEVICE

FIELD OF THE INVENTION

The present invention relates to a zinc oxide based (hereinafter referred to as ZnO based, too) compound semiconductor device such as a light emitting device such as a light emitting diode (LED), a laser diode or the like, a transistor device such as a HEMT or the like, or the like, using the ZnO based semiconductor such as ZnO, MgZnO based (which means that a mixed crystal ratio of Mg and Zn can be varied variously and the same applies hereinafter) compound or the like. More particularly, the present invention relates to a ZnO based compound semiconductor device which can inhibit influence to an applied voltage, such as increasing of a drive voltage caused by generation of a piezoelectric field, or the like, even when the semiconductor device is formed by laminating ZnO and MgZnO based compound or the like in a hetero junction and an electric voltage (electric field) is applied in a direction of laminating.

BACKGROUND OF THE INVENTION

Lately, nitride semiconductor light emitting devices such as a blue light emitting diode (LED) or a laser diode, using nitride semiconductor, have been in practical use. On the other hand, a ZnO based compound is superior to a GaN based compound (which means a GaN or a compound in which a part or all of Ga of GaN is substituted with other element of group III element and the same applies hereinafter) in emitting light in a range of a short wavelength. Concretely, an exciton of ZnO, which is formed by recombination of a hole and an electron in a solid, is stable even in a room temperature because of having a large binding energy of 60 meV (GaN has that of 24 meV). Further, in GaN based compound, although light is emitted with high efficiency by using an InGaN based compound (which means that a mixed crystal ratio of In and Ga can be varied variously and the same applies hereinafter) by adding In, the efficiency is lowered accompanied with decreasing of In. It is said in case of InGaN based compound that it is unnoticeable for crystal defects, because portions of low potential arise partially by variation in a concentration of In and carriers are captured there. On the contrary, when In decreases, it is understood that the crystal defects become noticeable since the concentration of In is unified and especially, portions where carriers are easily captured do not arise. Such problem does not occur in ZnO based compound even the wavelength is shortened, though the InGaN based compound becomes more disadvantageous to shortening the wavelength. Of course, GaN itself or AlGaN based compound (which means that a mixed crystal ratio of Al and Ga can be varied variously and the same applies hereinafter) becomes disadvantageous to further shortening of the wavelength.

A light emitting device having a structure shown in FIG. 7 is known as a light emitting device using a ZnO based compound (cf. for example PATENT DOCUMENT 1). In FIG. 7, on a sapphire substrate 31, a buffer layer 32 made of ZnO, and an n-type contact layer 33 made of n-type ZnO are formed, and thereon, a light emitting layer forming portion 38 is formed by laminating an n-type clad layer 34 made of MgZnO based compound, an active layer 35 made of CdZnO based compound, and a p-type clad layer 36 made of MgZnO based compound. Further a p-type contact layer 37 made of Zno is deposited, and a part of the n-type contact layer 33 is exposed by etching a part of a semiconductor lamination portion. Thereafter, an n-side electrode 39 is formed on an exposed surface, and a p-side electrode 40 is formed on a surface of the p-type contact layer 37.

PATENT DOCUMENT 1: Japanese Patent Application Laid-Open No. 2002-94114
PATENT DOCUMENT 2: WO01/73170A1

DISCLOSURE OF THE INVENTION

Problem to be Solved by the Present Invention

As described above, when ZnO based compound layers are laminated, a sapphire substrate is generally used as a substrate and ZnO based compound semiconductor layers are laminated so as to be oriented to a c-axis by using the substrate having a principal plane of a plane C. However, it was found that when such device as a light emitting device described above or the like is formed by forming a semiconductor lamination portion having a hetero junction of ZnO and MgZnO based compound which is different material from that of a substrate and oriented to a c-axis, with using a substrate having a plane C as a principal plane, increasing of an applied forward voltage is needed, extra joule heat is generated and a life time of the device is shortened, as described later.

On the other hand, it, is known that zinc oxide layers are grown so as to be oriented to an axis [11-20] by using a sapphire substrate having a principal plane of a plane A and, in order to improve crystallinity (cf. for example PATENT DOCUMENT 2). However, since the sapphire substrate and ZnO are not matched to each other in lattice, dislocations arise in a direction of a c-axis and satisfactory crystal layer cannot be obtained, in this orientation.

The present invention is directed to solve the above-described problems and an object of the present invention is to provide a zinc oxide based compound semiconductor device which does not cause increasing a drive voltage even when a semiconductor device is formed by forming a lamination portion having a hetero junction of ZnO based compound semiconductor layers while using ZnO based compound semiconductor more advantageous than GaN based compound in emitting light of a short wavelength, and has excellent crystallinity.

Another object of the present invention is to provide a semiconductor light emitting device which can efficiently emit light in a range of a short wavelength such as especially 460 nm or less.

Means for Solving the Problem

It was found that when a light emitting device is formed by laminating ZnO based compound semiconductor layers, life time of the device is shortened because of increasing a driven voltage and generating extra joule heat, and also found, as a result of further earnest and repeated study on a cause thereof, that the cause is originated in a piezoelectric field (electric field generated by stress) generated depending on a strain which arises between a substrate and a ZnO based compound layer or two of semiconductor layers laminated, depending on difference in lattice constants since ZnO based compound is piezoelectric material, when a hetero junction such as a junction between a sapphire substrate and ZnO layer, ZnO layer and MgZnO based compound layer or the like is formed. Namely, the piezoelectric field makes a potential barrier applied additionally to carriers, and the drive voltage is raised by rising of a built-in voltage in a diode or the like.

In detail, when stress is applied to a crystal having piezoelectricity as shown in FIGS. 6(a) and 6(b), a piezoelectric field generates with electric charges of + or − which appear reversely by whether the stress is a compressive force or a tensile force. Here, a crystal of a hexagonal system such as ZnO has no symmetry in a direction of a c-axis, and a c-axis direction (plane perpendicular to the plane C) is a nonpolar plane in which two directions distinguished by deviation of electric charge exist. Therefore, electric charges of + and − are generated on both sides of a plane C of the crystal by the stress described above, and electric charges are not generated or generated very slightly on the plane A and the plane M which are non-polar planes. It was also found that a cause of rising of a drive voltage, which is shown by 'C' in FIG. 3 described later, is rising of a built-in voltage caused by arising of electric charges of +at a ZnO layer 33 side of a MgZnO layer 34 and electric charges of a reverse polarity at a reverse side, in which a compressive strain is generated in the MgZnO layer 34 between the ZnO layer 33 and the MgZnO layer 34 laminated on the plane C as shown in FIG. 6(c).

Then, it was found that the problem caused by the piezoelectric field can be solved by laminating ZnO based compound semiconductor layers such that a plane on which electric charges are generated by a stress is parallel to a direction of an electric field applied to a device (such that a piezoelectric field is perpendicular to an electric field applied to a device) and further that single crystal layer much excellent in crystallinity can be obtained in which the c-axis is orientated within the plane because difference in lattice constants among ZnO based compounds is not larger than that between sapphire and ZnO based compound.

Here, the zinc oxide (ZnO) based compound semiconductor means an oxide including Zn, and means concretely besides ZnO, an oxide of one or more elements of group IIA and Zn, an oxide of one or more elements of group IIB and Zn, or an oxide of elements of group IIA and group II B and Zn.

A zinc oxide based compound semiconductor device according to the present invention includes a substrate made of $Mg_xZn_{1-x}O$ ($0 \leq x \leq 0.5$) in which a plane A (11-20) or a plane M (10-10) is a principal plane, and single crystal layers made of ZnO based compound semiconductor epitaxially grown on the principal plane of the substrate made of the $Mg_xZn_{1-x}O$ in such orientation that a plane parallel to the principal plane is a plane {11-20} or a plane {10-10} and a plane perpendicular to the principal plane is a plane {0001}.

Here, each of (11-20), (10-10), {11-20} and {10-10} means strictly follows, respectively (11$\bar{2}$0), (10$\bar{1}$0), {11$\bar{2}$0} and {10$\bar{1}$0}, However, an abbreviated notation is used as described above in convenience. In addition, for example, a plane {11-20} means a general term meaning including planes equivalent to a plane (11-20) by symmetry of crystals.

In concrete, a semiconductor light emitting device, which has a low drive voltage and excellent device characteristics by inhibiting extra generation of joule heat, can be obtained by constituting the zinc oxide based compound semiconductor light emitting device by laminating single crystal layers of the ZnO based compound semiconductor on the substrate as a semiconductor lamination portion including a hetero junction so as to form a light emitting layer of a light emitting diode or a laser diode. In addition, even when laminating so as to constitute a transistor, a stress accompanied with a hetero junction works, a piezoelectric field generated by the stress has a different direction from that of application of a gate voltage, and has no influence to upon the characteristics of the transistor, and a high speed transistor with a small leakage current and excellent withstanding voltage can be obtained since the crystallinity is excellent.

Furthermore, although crystal defects increase and light emitting characteristics is lowered in case of forming a light emitting device in a short wavelength region by using GaN based compound, such problem does not arise in the present invention and a semiconductor light emitting device in a short wavelength region, with a low drive voltage and excellent internal quantum efficiency can be obtained by forming the semiconductor lamination portion such that the semiconductor lamination portion has a light emitting layer forming portion made of $Mg_yZn_{1-y}O$ ($0 \leq y \leq 0.3$), the light emitting layer forming portion being formed by sandwiching an active layer by semiconductor layers having a band gap energy larger than that of the active layer, and emitting a light of a short wavelength of 460 nm or less by applying a drive voltage to both sides sandwiching the active layer.

Effect of the Invention

According to the present invention, ZnO based compound semiconductor layers are epitaxially grown on a surface of a substrate made of $Mg_xZn_{1-x}O$ ($0 \leq x \leq 0.5$), a principal plane of which is a plane A (11-20) or a plane M (10-10). So, perfect single crystal layers are grown in which a plane perpendicular to the principal plane is orientated to a plane {0001} (c-axis is orientated within the surface plane, too) without superposing a gradient layer, a buffer layer or the like to alleviate lattice mismatching, since a plane parallel to the principal plane is laminated being orientated to a plane {11-20} or a plane {10-10} and the substrate is a compound of the same kind as ZnO based compound to be laminated. Moreover, the plane C appears not on a surface on which semiconductor layers are laminated but in a direction perpendicular to the surface of the lamination layers. As a result, even when a piezoelectric field is generated by stress arising between a substrate and a semiconductor layer laminated thereon or between the semiconductor layers by a hetero junction caused by difference in mixed crystal ratios of Mg or the like, since the piezoelectric field is an electric field of a direction perpendicular to an electric field generally applied in a direction of perpendicular to a semiconductor lamination portion, the piezoelectric field does not give any influence to applied voltage for a device. As a result, in case of forming a light emitting device by laminating, for example, ZnO based compound semiconductor layers with a hetero junction, there exists no problem such as rising of a drive voltage. Thereby, deterioration of devices or decrease of life time does not occur.

EXPLANATION OF LETTERS AND NUMERALS

Figure 1:
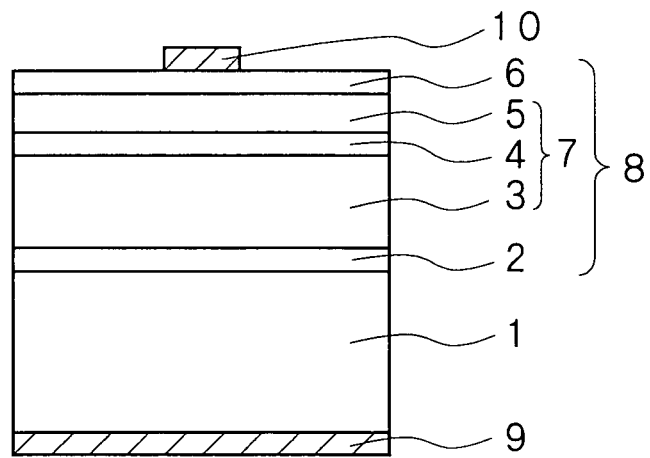
FIG. 1 is a cross-sectional view explaining an LED of an embodiment of the ZnO based compound semiconductor device according to the present invention.

1: substrate
2: n-type buffer layer
3: n-type layer
4: active layer
5: p-type layer
6: p-type contact layer
7: light emitting layer forming portion
8: semiconductor lamination portion
9: n-side electrode
10: p-side electrode

THE BEST EMBODIMENT OF THE PRESENT INVENTION

An explanation will be given below of a zinc oxide based (ZnO based) compound semiconductor device according to the present invention in reference to the drawings. The zinc oxide based compound semiconductor device according to the present invention is formed, as an explanatory cross-sectional view of a light emitting diode (LED) of an embodiment thereof is shown in FIG. 1, by using a substrate 1 made of $Mg_xZn_{1-x}O$ (0≤x≤0.5), the principal plane of which is a plane A (11-20) or a plane M (10-10), and by forming single crystal layers 2 to 6 made of zinc oxide based compound semiconductor, which are epitaxially grown on the principal plane of the substrate 1 in such orientation that a plane parallel to the principal plane is the plane {11-20} or the plane {10-10} and a plane perpendicular to the principal plane is the plane {0001}.

Figure 2:
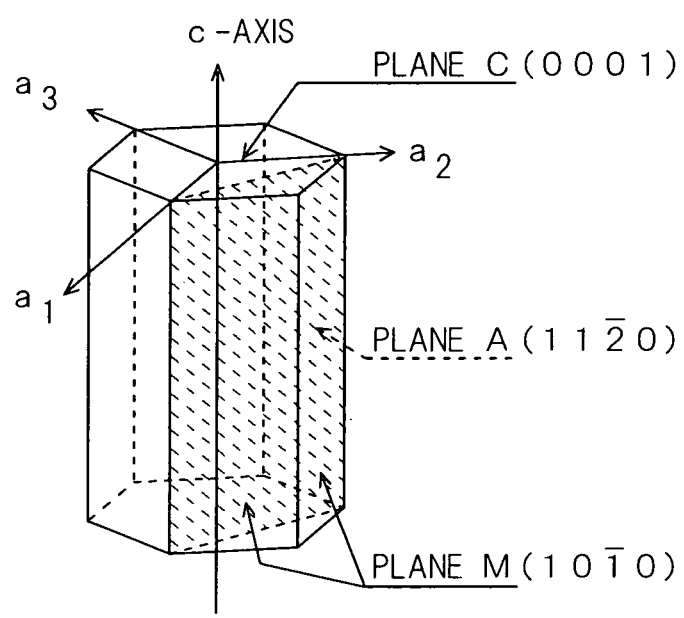
FIG. 2 is a figure showing a plane A and a plane M of a substrate used in the semiconductor device according to the present invention.

The substrate 1 is made of $Mg_xZn_{1-x}O$ (for example, ZnO of x=0) and polished such that the principal plane is the plane A or the plane M. As described above, it is because influence of the piezoelectric field by the stress does not affect a drive voltage of a device by using the plane A or the plane M for the principal plane, even when a stress accompanied with a hetero junction works on semiconductor layers. ZnO based compound, for example $Mg_xZn_{1-x}O$, has a structure of a hexagonal system shown by a perspective view and a plan view in FIG. 2 showing a schematic figure of a crystal structure, and as the plane A and the plane M are shown respectively in FIG. 2, both are planes perpendicular to the plane C. The substrate 1 is formed such that the plane A or the plane M is a plane for growth of semiconductor layers. On the contrary, although the plane C is perpendicular to the principal plane (the c-axis is parallel to the principal plane), the plane C (the c-axis) is also grown orientated since the substrate and semiconductor layers to be grown are ZnO based compound of the same kind. The substrate 1 may be ZnO of x=0, or may be MgZnO based compound of a mixed crystal of Mg having a concentration of 50 at % or less. It is not preferable that a concentration of Mg is over 50 at % since MgO is a crystal of a NaCl type which does not match with ZnO based compound of a hexagonal system.

The $Mg_xZn_{1-x}O$ substrate is formed by cutting out wafers from an ingot formed by a hydrothermal synthesis method. The cutting out is carried out such that the principal plane is the plane A or the plane M, as described above. Although crystallinity (excellent orientation of the c-axis) of ZnO based compound to be grown is not affected even when a mixed crystal ratio of Mg of the substrate 1 is zero, it is preferable that material has a band gap larger than the band gap corresponding to a wavelength of the light to be emitted (composition of the active layer), because the light emitted is not absorbed by the substrate 1.

In the example shown in FIG. 1, a semiconductor lamination portion 8 includes a buffer layer 2 made of n-type ZnO and having a thickness of, for example, approximately 10 nm, a light emitting layer forming portion 7 and a contact layer 6 made of p-type ZnO and having a thickness of approximately 10 to 30 nm. Though, the example is shown as an example of a simple structure and the structure is not limited to the lamination structure.

In the example shown in FIG. 1, the light emitting layer forming portion 7 is formed in a double hetero junction structure in which an active layer 4 is sandwiched by an n-type layer 3 and a p-type layer 5 which are made of $Mg_yZn_{1-y}O$ (0≤y≤0.3, for example y=0.1) having a band gap energy larger than that of the active layer 4. Although not shown in the figure, the active layer 4 is formed in a multi quantum well structure (MQW) which is formed in a lamination structure composed of, for example from a lower layer side, an n-type guide layer made of n-type $Mg_zZn_{1-z}O$ (0≤z≤0.15, for example z=0.05) having a thickness of approximately 0 to 15 nm, a lamination portion formed by laminating a $Mg_{0.1}Zn_{0.9}O$ layer having a thickness of approximately 6 to 15 nm and a ZnO layer having a thickness of approximately 1 to 5 nm, alternately six times, and a p-type guide layer made of p-type $Mg_zZn_{1-z}O$ having a thickness of approximately 0 to 15 nm, so as to emit light having, for example, a wavelength of approximately 365 nm. However, the structure of the light emitting layer forming portion 7 is not limited to this example, and, for example, a structure of the active layer 4 may be a single quantum well (SQW) structure or a bulk structure, and a p-n structure of a single hetero junction may be used instead of the double hetero junction. In addition, the n-type layer 3 or the p-type layer 5 may be formed in a structure of a lamination by a barrier layer and a contact layer, a gradient layer may be provided between layers of a hetero junction, and still, a reflection layer may be formed at a substrate side.

Then, after a back surface of the substrate 1 is polished so that a thickness of the substrate 1 is approximately 100 μm, an n-side electrode 9 is formed by laminating Ti and Al on the back surface and sintering. And a p-side electrode 10 is formed in a lamination structure of Ni/Au by a lift off method on a surface of the p-type contact layer 6. Thereafter a wafer is divided into chips. The n-side electrode 9 may be formed on a surface of the n-type layer 3 exposed by etching a part of the semiconductor lamination portion 8 instead of forming on the back surface of the substrate 1.

In manufacturing the light emitting diode, firstly a wafer is formed by cutting an ingot of ZnO made by, for example, a hydrothermal synthesis method at a plane A (11-20) or a plane M (10-10) and polishing by a CMP (chemical mechanical polish) method. An MBE apparatus is used in growing ZnO based compound, which is equipped with a radical source generating oxygen radical in which reaction activity of oxygen is enhanced by RF plasma. A radical source of the same type is prepared for nitrogen of a dopant of p-type ZnO. Metal Zn, metal Mg or the like having a purity of 6-N (99.9999%) or more is used for a Zn source, a Mg source and a Ga source (n-type dopant) and vaporized from a knousen cell (evaporation source). A shroud in which liquid nitrogen flows is provided around the MBE chamber so that a wall surface is not heated by heat radiation from the cell or a substrate heater. Thereby, high vacuum of approximately $1 \times 10^{-9}$ Torr can be maintained inside of the chamber.

The above-described wafer made of ZnO and polished by the CMP method is set within the MBE apparatus, a thermal cleaning is carried out at a temperature of approximately 700° C. Thereafter the temperature of the substrate is lowered to approximately 600° C. and the n-type buffer layer 2 is grown. Then, the semiconductor lamination portion 8 is formed by growing successively each layer of the above-described constitution. Then, as described above, after thinning the substrate 1, there are formed the p-side electrode 10 of the lamination structure of Ni/Au on the p-type contact layer 6 of a surface side by a lift off method using a vapor deposition method or the like, and the n-side electrode 9 ensuring ohmic characteristics by sintering Ti/Al laminated on a back surface of the substrate 1 at 600° C. and for approximately 1 min. Thereafter, chips are obtained from the wafer by dicing or the like.

Figure 3:
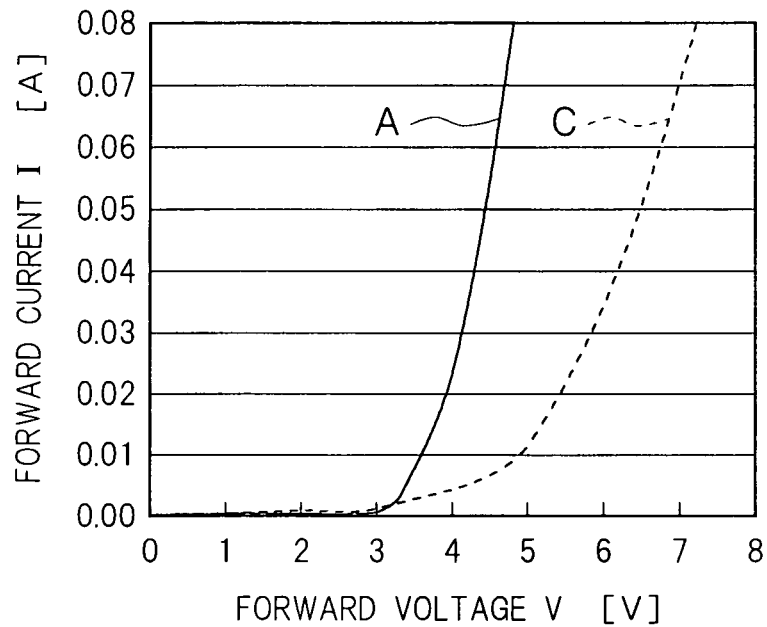
FIG. 3 is a figure showing the V-I characteristics (A) of an LED having a structure shown in FIG. 1, comparing with the V-I characteristics (C) of an LED formed by laminating ZnO based compound layers by the prior art in which a plane C is a principal plane.

The V-I characteristic of an LED formed in such manner is shown in FIG. 3. Namely, in FIG. 3, in which a forward voltage V (a unit is V) is represented by a lateral axis, a forward current I (a unit is A) by a vertical axis, and a relationship of both is shown, 'A' shows the V-I characteristic of the LED according to the present invention, which is formed with ZnO based compound semiconductor layers grown on the substrate having the plane A as a principal plane, such that a plane parallel to the principal plane is a plane {11-20} and a plane perpendicular to the principal plane is orientated to the plane {0001}, and 'C' shows the V-I characteristics of a conventional LED formed such that a plane C is a principal plane and orientated to a c-axis. Obviously from FIG. 3, a drive voltage can be lowered by several volts in the LED of a drive current approximately 20 mA, by the present invention.

Although the above-described example is an example of an LED, since, in a laser diode, a semiconductor lamination portion of a hetero junction is formed and a drive voltage is applied in a direction perpendicular to a surface of the lamination portion, a semiconductor laser with a high characteristics of a low drive voltage and a low threshold current can be obtained by using the substrate 1 made of $Mg_xZn_{1-x}O$ (0≤x≤0.5) in which the plane A (11-20) or the plane M (10-10) is the principal plane and by growing semiconductor layers in such orientation that the plane parallel to the principal plane is the plane {11-20} or the plane {10-10} and the plane perpendicular to the principal plane is the plane {0001}. An example of a structure of such semiconductor laser is shown in FIG. 4.

Figure 4:
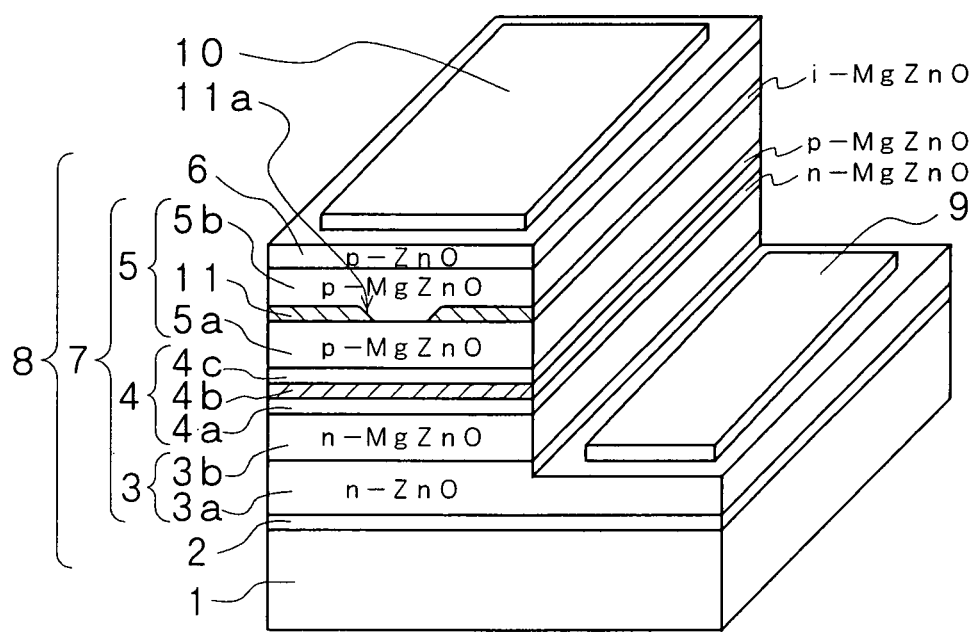
FIG. 4 is a cross-sectional view showing an example of a constitution of an LD formed by the present invention.

In FIG. 4, a substrate 1 and a buffer layer 2 are same as those in the example shown in FIG. 1. In this example, a light emitting layer forming portion 7 is formed of an n-type layer 3 composed of an n-type contact layer 3a made of ZnO and a barrier layer (clad layer) 3b made of $Mg_yZn_{1-y}O$ (0≤y≤0.3, for example y=0.2), an active layer 4 composed of an n-type guide layer 4a made of n-type $Mg_zZn_{1-z}O$ (for example z=0.05), a lamination portion 4b made of $Mg_{0.1}Zn_{0.9}O/ZnO$, and a p-type guide layer 4c made of p-type $Mg_zZn_{1-z}O$, and a p-type layer 5 which is divided into a first layer 5a and a second layer 5b as shown in the figure, both of which are made of same $Mg_yZn_{1-y}O$ (0≤y≤0.3), and between them, an electric current constriction layer 11 provided with a stripe groove 11a and made of $Mg_aZn_{1-a}O$ (0<a≤0.3, for example a=0.15) of an i-type or n-type is inserted. Then, on a surface thereof, a p-type contact layer 6 made of p-type ZnO is deposited, and, as a result, the semiconductor lamination portion 8 is constituted by semiconductor layers from the buffer layer 2 to the contact layer 6. Subsequently, a p-side electrode 10 is made of same material as that described above on the contact layer 6 and it is formed on almost whole surface in this case since light is not taken out from a surface side of the lamination portion, and an n-side electrode 9 is formed on the n-type contact layer 3a exposed by removing a part of the semiconductor lamination portion 8 by etching. The n-side electrode 9 may be formed on a back surface of the substrate 1, same as in the example shown in FIG. 1.

In such LD, although a piezoelectric field caused by a stress with a hetero junction is also generated, a drive voltage of the LD is hardly influenced since semiconductor layers are laminated on the substrate in which the plane A or the plane M is a principal plane, and an Ld with a high characteristics with excellent crystallinity of semiconductor layers and a low threshold current can be obtained.

Figure 5:
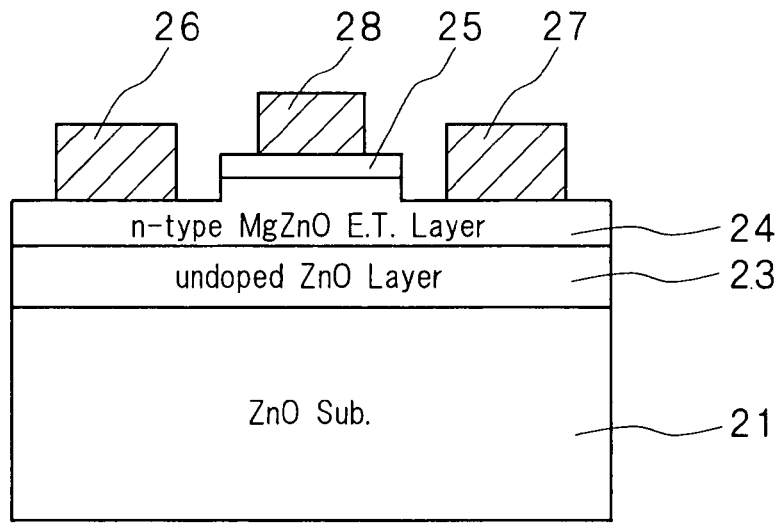
FIG. 5 is a cross-sectional view explaining an example of a constitution of a transistor formed by the present invention.
Figure 6:
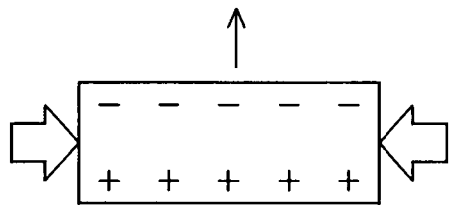
FIG. 6 is a figure explaining generation of electric charges in case of applying stress to a piezoelectric crystal.
Figure 6:
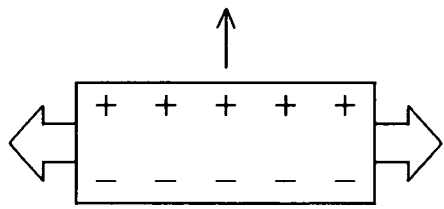
Figure 6:
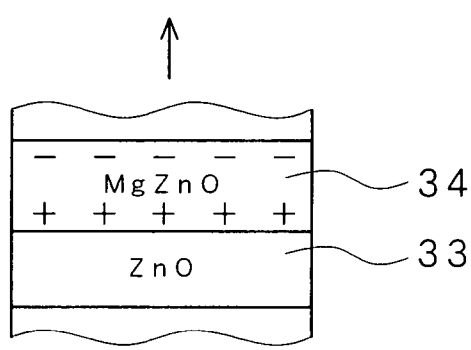
Figure 7:
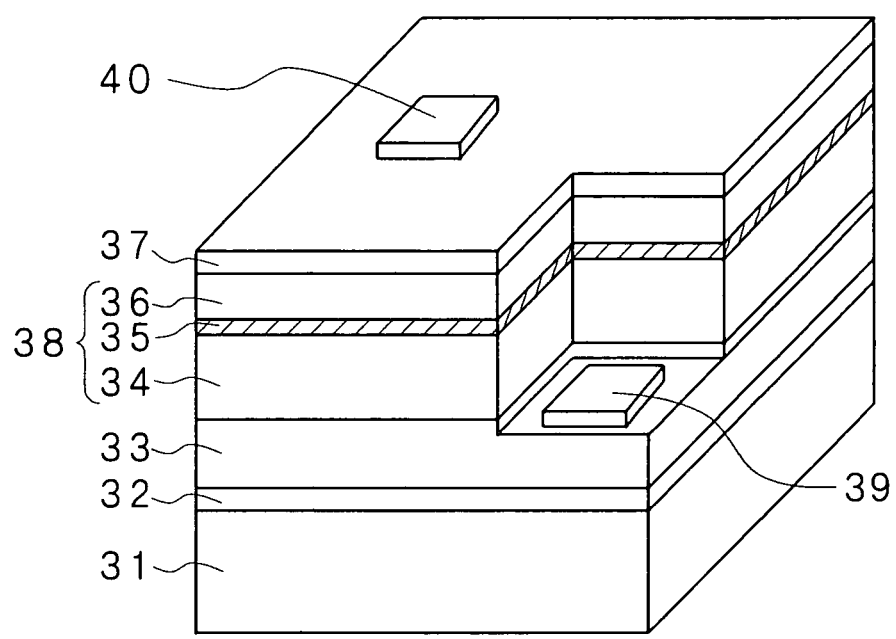
FIG. 7 is a figure showing one constitution of LEDs by the prior art, using ZnO based compound semiconductor.

FIG. 5 is a cross-sectional view explaining a transistor constituted by ZnO based compound semiconductor layers which are grown on a principal plane of a substrate 1 made of ZnO, the principal plane of which is the plane A (11-20) or the plane M (10-10), in such orientation that a plane parallel to the principal plane is the plane {11-20} or the plane {10-10} and a plane perpendicular to the principal plane is the plane {0001}. In the example, there are grown sequentially an undoped ZnO layer 23 of approximately 4 μm thickness, an n-type MgZnO based compound electron transit layer 24 of approximately 10 nm thickness and an undoped MgZnO based compound layer 25 of approximately 5 nm thickness, and then, the electron transit layer 24 is exposed by removing the undoped MgZnO based compound layer 25 except a region of a width of approximately 1.5 μm for a gate length by etching. Thereafter, the transistor is formed by forming a source electrode 26 and a drain electrode 27 formed with, for example, a Ti film and an Al film on the electron transit layer 24 exposed by etching, and a gate electrode 28 formed by laminating, for example, a Pt film and an Au film on a surface of the undoped MgZnO based compound layer 25. Since transistor characteristics is not influenced even when a stress accompanied with a hetero junction works, because a direction of an electric field generated by the stress is different from a direction of applying a gate voltage by growing ZnO based compound semiconductor layers on the principal plane of the substrate 1 made of $Mg_xZn_{1-x}O$ (0≤x≤0.5), the principal plane of which is the plane A or the plane M, and since the semiconductor layers are orientated to not only an a-axis but also a c-axis, a high speed transistor (HEMT) with excellent crystallinity, a small leakage current and a high withstand voltage can be obtained.

Industrial Applicability

Light emitting devices such as an LED, a laser diode or the like and transistor devices such as a HEMT or the like, using zinc oxide based compound semiconductor, can be improved in characteristics, and can be utilized for electronic appliances of various kinds using the semiconductor devices.

What is claimed is:

1. A zinc oxide based compound semiconductor device comprising:
    a substrate made of $Mg_xZn_{1-x}O$ (0≤x≤0.5) in which a plane A (11-20) or a plane M (10-10) is a principal plane; the substrate being a bulk substrate before epitaxially growing any semiconductor layer thereon;
    semiconductor layers apitaxially grown on the principal plane of the substrate, each of the semicomductor and being a single crystal layer made of ZnO based compound semiconductor and being grown in such orientation that a plane parallel to the principal plane is a plane {11-20} or a plane {10-10}, whereby a grown plane is a same plane as the principal plan of the subtrate, and a plan perpendicular to the principal plane is a plane {0001}, and a pair of electrodes, including a first electrode provided directly on a back surface of the substrate, which is a opposite surface to the principal plane, and a second electrode provided either on or over the semiconductor layers.

2. The zinc oxide based compound semiconductor device according to claim 1, wherein the zinc oxide based compound semiconductor light emitting device is constituted by laminating single crystal layers of the ZnO based compound semiconductor on the substrate as a semiconductor lamination portion including a hetero junction so as to form a light emitting layer of a light emitting diode.

3. The zinc oxide based compound semiconductor device according to claim 2, wherein the semiconductor lamination portion has a light emitting layer forming portion made of $Mg_xZn_{1-x}O$ ($0 \leq x \leq 0.3$), the light emitting layer forming portion being formed by sandwiching an active layer by semiconductor layers having a band gap energy larger than that of the active layer, and emitting a light of a short wavelength of 460 nm or less by applying a drive voltage to both sides sandwiching the active layer.

4. The zinc oxide based compound device according to claim 1, wherein the zinc oxide based compound layers are laminated so as to form a transistor on a buffer layer which is the single crystal layer.

5. The zinc oxide based compound semiconductor device according to claim 1, wherein the zinc oxide based compound semiconductor light emitting device is constituted by laminating single crystal layers of the ZnO based compound semiconductor on the substrate as a semiconductor lamination portion including a hetero junction so as to form a light emitting layer of a laser diode.

* * * * *